US007625992B2

(12) United States Patent
Ionkin

(10) Patent No.: US 7,625,992 B2
(45) Date of Patent: Dec. 1, 2009

(54) PROCESSES FOR POLYURETHANE POLYMERIZATION USING POLYSILYL DERIVATIVES OF GERMANIUM AND TIN AS CATALYSTS

(75) Inventor: Alex Sergey Ionkin, Kennett Square, PA (US)

(73) Assignee: E. I. Du Pont de Nemours and Company, Wilmington, DE (US)

( * ) Notice: Subject to any disclaimer, the term of this patent is extended or adjusted under 35 U.S.C. 154(b) by 344 days.

(21) Appl. No.: 11/407,003

(22) Filed: Apr. 18, 2006

(65) Prior Publication Data

US 2007/0244292 A1 Oct. 18, 2007

(51) Int. Cl.
*C08G 18/08* (2006.01)
*B01J 21/00* (2006.01)

(52) U.S. Cl. ............................. 528/58; 528/56; 502/242

(58) Field of Classification Search .................. 525/18; 502/242; 528/55, 58
See application file for complete search history.

(56) References Cited

U.S. PATENT DOCUMENTS

| 4,788,083 | A | * | 11/1988 | Dammann et al. | .......... 427/340 |
| 6,187,711 | B1 | * | 2/2001 | Bernard et al. | ............. 502/152 |
| 7,153,811 | B2 | * | 12/2006 | Wallace et al. | ............. 502/349 |

FOREIGN PATENT DOCUMENTS

WO 9521694 8/1995

OTHER PUBLICATIONS

Brook, A.G. et al., "Synthesis of Some Tris(Trimethylsilyl)Germyl Compounds", J. Organometallic Chemistry, 299 (1986), pp. 9-13.
Mallela, S.P. et al., "Synthesis and Characterization of Hexakis(Trimethylsilyl)Digermane and -Distannane", Inorg. Chem., 1993, 32, pp. 5623-5625.
Dolbier Jr., W.R. et al., "A New and Practical Synthesis of Octafluoro(2.2)Paracyclophane", J. Org. Chem., 1997, 62, pp. 7500-7202.

* cited by examiner

*Primary Examiner*—Randy Gulakowski
*Assistant Examiner*—Michael Leonard
(74) *Attorney, Agent, or Firm*—Gail D. Tanzer

(57) ABSTRACT

Processes for polyurethane polymerization are provided. The processes use polysilyl derivatives of germanium and tin as catalysts. Polyurethanes made using the catalysts have increased gel times as compared to polyurethanes made using conventional processes.

6 Claims, No Drawings

PROCESSES FOR POLYURETHANE POLYMERIZATION USING POLYSILYL DERIVATIVES OF GERMANIUM AND TIN AS CATALYSTS

FIELD OF THE INVENTION

The present invention relates to processes for polyurethane polymerization. The processes use polysilyl derivatives of germanium and tin as catalysts.

BACKGROUND

Coating manufacturers have achieved significant progress in developing novel components for polyurethanes to improve coating properties, although a need remains for novel catalyst systems. Typical catalysts for making polyurethanes are dibutyltindilaurate and tertiary amines.

Organometallics of the group 14 elements, particularly dibutyltin derivatives, are known to catalyze transesterification, transcarbamoylation and urethane formation. While there has been significant progress to develop novel components for polyurethanes to improve coating properties, a need remains for novel catalyst systems for use in making the polyurethanes. Typical catalysts are dibutyltindilaurate and tertiary amines. Dialkyl and trialkyltin derivatives, classes of the compounds to which dibutyltindilaurate belongs to, have some toxicity to humans, further driving a need for new, less toxic catalysts. New processes for forming polyurethanes are also desired.

Jousseaume, B. et al., ("Air Activated Organotin Catalysts for Silicone Curing and Polyurethane Preparation" (1994) Organometallics 13:1034), and Bernard, J. M. et al. (U.S. Pat. No. 6,187,711) describe the use of distannanes as latent catalysts, e.g. $Bu_2(AcO)SnSn(OAc)Bu_2$. Upon exposure to air, such species oxidize to give distannoxanes, e.g. $Bu_2(AcO)SnOSn(OAc)Bu_2$, which are known to be highly active for urethane formation. However, the carboxylate-substituted distannanes are themselves catalysts for the reaction, and have been reported to be "relatively stable in air", which suggests that oxidation to form an active catalyst is slow. See U.S. Pat. No. 3,083,217 to Sawyer et al. UV light appears to be necessary in order to induce oxidation at an appreciable rate in these distannanes. Thus, there exists a need for a catalyst precursor that, in the absence of air, is a very poor catalyst and yet, upon exposure to air, rapidly forms a highly active catalyst that allows for rapid cure.

Co-owned and co-pending U.S. patent application Ser. Nos. 11/154,387 and 11/154,224 describe air activated organotin catalysts without protecting groups. While the catalysts described in these applications are latent, i.e. active only in the presence of air, they lose their latency upon prolonged exposure to isocyanate. As a result, they cannot be stored in isocyanate. Moreover, because they are air-sensitive, they must be kept from air until spray application.

Co-owned and co-pending U.S. Pat. applications (CL-3032 and CL-3268) describe how the catalysts of U.S. patent application Ser. Nos. 11/154,387 and 11/154,224 can be protected using labile protecting groups, which render them stable in air and stable in isocyanate, at least for several days. Upon contacting a isocyanate solution of the protected catalyst with an alcohol, optionally in the presence of acid, the catalyst is deprotected and can be activated by air during the spray application process.

Co-pending and co-owned U.S. Pat. applications (CL-3191, CL-3280) disclose divalent tin and germanium compounds and their use as catalysts. (CL-3191) discloses divalent derivatives of tin stabilized by bulky phenoxy groups. (CL-3280) discloses divalent tin and germanium compounds stabilized through bulky chelating P^O ligands.

The present invention provides processes using, as catalysts, quadrivalent tin and germanium compounds containing more than one triorganylsilyl groups connected to tin or germanium.

The catalytic use of the materials described herein, for the production of polyurethanes, has not been heretofore disclosed.

SUMMARY OF THE INVENTION

One aspect of the present invention is a process comprising:
a) providing a catalyst of the formula

wherein
E is tin or germanium;
$R^1$ and $R^2$ are each independently H, C1 to C10 alkyl, C5 to C12 aryl,
silicon, tin or germanium; and
n is 0, 1 or 2;
b) providing one or more isocyanate-reactive compound(s);
c) providing one or more compounds comprising isocyanate groups;
d) combining said catalyst, said isocyanate-reactive compound(s) and said isocyanate-comprising compound(s), to form a polyurethane-comprising material.

DETAILED DESCRIPTION

The present invention provides, in some embodiments, processes using polysilyl derivatives of tin and germanium as catalysts, particularly for polyurethane formation.

The compounds used as catalysts in some of the embodiments of the present invention are of the formula

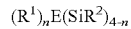

wherein
E is tin or germanium;
$R^1$ and $R^2$ are each independently H, alkyl, aryl, silicon, tin or germanium; and
n is 0, 1 or 2;

Tris(trimethylsilyl)germane can be prepared by the sequence of the reactions depicted below, and as described in Brook, A. G.; Abdesaken, F.; Soellradl, H. Synthesis of some tris(trimethylsilyl)germyl compounds. Journal of Organometallic Chemistry, (1986), 299(1), 9-13.

Tetrakis(trimethylsilyl)tin can be prepared by the following procedure, and as described in the following articles: Buerger, Hans; Goetze, Ulrich. Trimethylsilyl derivatives of germanium and tin. Electron-balance bonds of silicon. Angewandte Chemie, International Edition in English (1968), 7(3), 212-13; and Mallela, Siva P.; Geanangel, R. A. Synthesis and characterization of hexakis(trimethylsilyl)digermane and -distannane. Inorganic Chemistry, (1993), 32(24), 5623-5.

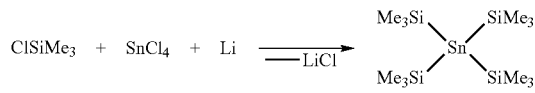

Trimethylsilyl(tributyl)tin was prepared by the following route and as described in Dolbier, William R. Jr.; Rong, Xiao X.; Xu, Yuelian; Beach, William F. A New and Practical Synthesis of Octafluoro[2,2]paracyclophane. Journal of Organic Chemistry (1997), 62(21), 7500-7502.

The production of polyurethane is usually achieved by the addition of polymeric polyols on isocyanates. Polyols are generally defined as polymeric or oligomeric organic species with at least two hydroxy functionalities. A schematic of a polyol generally used is shown below as structure 7, and is referred to as Polyol herein. It is available from DuPont, Wilmington, Del.

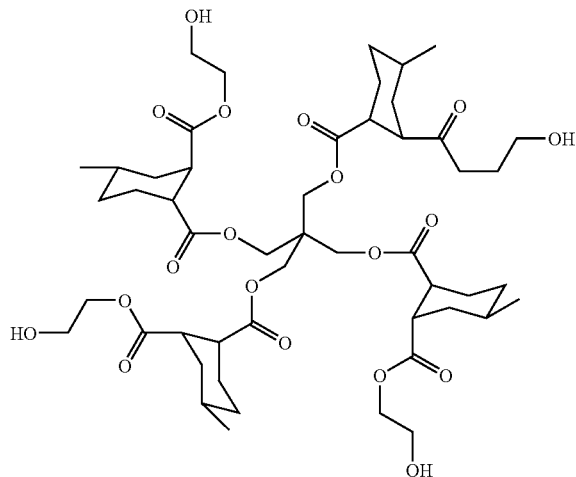

An example of the isocyanate with functional groups capable of reacting with hydroxyl is as follows:

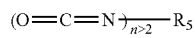

wherein $R_5$ is a alkyl structure such as ethyl, propyl, phenyl and the like. In some preferred embodiments, $R_5$ is $(CH_2)_6$.

Examples of suitable polyisocyanates include aromatic, aliphatic or cycloaliphatic di-, tri- or tetra-isocyanates, including polyisocyanates having isocyanurate structural units, such as, the isocyanurate of hexamethylene diisocyanate and isocyanurate of isophorone diisocyanate; the adduct of 2 molecules of a diisocyanate, such as, hexamethylene diisocyanate and a diol such as, ethylene glycol; uretidiones of hexamethylene diisocyanate; uretidiones of isophorone diisocyanate or isophorone diisocyanate; the adduct of trimethylol propane and meta-tetramethylxylene diisocyanate.

Additional examples of suitable polyisocyanates include 1,2-propylene diisocyanate, trimethylene diisocyanate, tetramethylene diisocyanate, 2,3-butylene diisocyanate, hexamethylene diisocyanate, octamethylene diisocyanate, 2,2,4-trimethyl hexamethylene diisocyanate, 2,4,4-trimethyl hexamethylene diisocyanate, dodecamethylene diisocyanate, omega, omega-dipropyl ether diisocyanate, 1,3-cyclopentane diisocyanate, 1,2-cyclohexane diisocyanate, 1,4-cyclohexane diisocyanate, isophorone diisocyanate, 4-methyl-1,3-di- isocyanatocyclohexane, trans-vinylidene diisocyanate, dicyclohexylmethane-4,4'-diisocyanate, 3,3'-dimethyl-dicyclohexylmethane4,4'-diisocyanate, a toluene diisocyanate, 1,3-bis(1-isocyanato1-methylethyl)benzene, 1,4-bis(1-isocyanato-1-methylethyl)benzene, 1,3-bis(isocyanatomethyl)benzene, xylene diisocyanate, 1,5-dimethyl-2,4-bis(isocyanatomethyl)benzene, 1,5-dimethyl-2,4-bis(2-isocyanatoethyl)benzene, 1,3,5-triethyl-2,4-bis (isocyanatomethyl)benzene, 4,4'-diisocyanatodiphenyl, 3,3'-dichloro-4,4'-diisocyanatodiphenyl, 3,3'-diphenyl-4,4'-diisocyanatodiphenyl, 3,3'-dimethoxy-4,4'-diisocyanatodiphenyl, 4,4'-diisocyanatodiphenylmethane, 3,3'-dimethyl-4,4'-diisocyanatodiphenyl methane, a diisocyanatonaphthalene, polyisocyanates having isocyanurate structural units, the adduct of 2 molecules of a diisocyanate, such as, hexamethylene diisocyanate or isophorone diisocyanate, and a diol such as ethylene glycol, the adduct of 3 molecules of hexamethylene diisocyanate and 1 molecule of water (available under the trademark Desmodur® N from Bayer Corporation of Pittsburgh, Pa.), the adduct of 1 molecule of trimethylol propane and 3 molecules of toluene diisocyanate (available under the trademark Desmodur® L from Bayer Corporation), the adduct of 1 molecule of trimethylol propane and 3 molecules of isophorone diisocyanate, compounds such as 1,3,5-triisocyanato benzene and 2,4,6-triisocyanatotoluene, and the adduct of 1 molecule of pentaerythritol and 4 molecules of toluene diisocyanate.

A specific example of an isocyanate capable of reacting with hydroxyl groups is Desmodur® 3300 isocyanate, available from Bayer. Desmodur® 3300 as available commercially, comprises a mixture of compounds, with a general structure as follows (also, pentamer, heptamer and higher molecular weight species can be present):

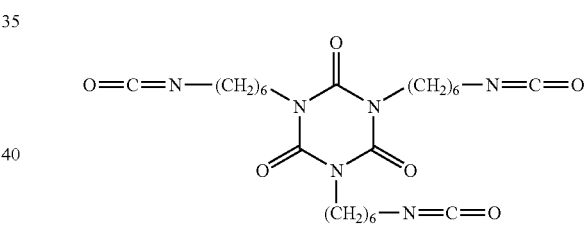

Molecular weights of any of the polymeric materials disclosed herein can be within a wide range. For example, the polymers can have relatively low molecular weights, e.g., from about 500 to about 3000 weight average molecular weight, preferably for some oligomeric materials from about 600 to about 2000 weight average molecular weight. Some polymers, which have OH functionalities, can have weight average molecular weights from about 2000 to about 300, 000, preferably from about 2500 to about 100,000, more preferably from about 2500 to about 50,000.

Other materials, which may optionally be present in the compositions and processes, include one or more solvents. The solvents preferably function only as solvents and also preferably do not contain functional groups such as hydroxyl or primary or secondary amino.

The polysilyl derivatives prepared according to processes herein were tested as catalysts for polyurethane formation. Two important parameters were recorded: gel time under anaerobic conditions (under nitrogen) and gel time under aerobic conditions. The "gel time" corresponds to the time in hours following activation at which flow is no longer observed in a coating mixture. The difference in "gel times" measured under aerobic and anaerobic conditions demonstrates "latency". As used herein, "latency" relates to the delay in the formation of the polyurethane when the ingredients are mixed in the presence of a catalyst. The catalysts and monomers for polyurethane can be premixed under anaerobic conditions without any substantial degree of the polymerization and would still be sprayable as coatings. Therefore, those polyurethanes which exhibit longer gel times are said to have longer latencies. Having longer gel times enables the monomers and catalysts to be mixed to produce polyurethanes that are still sprayable. As disclosed herein, the catalysts and monomers therefore can be mixed under anaerobic conditions without any substantial degree of polymerization and still sprayable for up to 8 more hours.

The present polyurethane compositions, and the process for crosslinking the polyurethanes in the presence of the catalysts described herein, are useful in making encapsulants, sealants, and coatings, especially transportation (automotive) and industrial coatings. As transportation coatings, the polyurethanes are useful as both OEM (original equipment manufacturer) and automotive refinish coatings. They may also be used as primer coatings. They often cure under ambient conditions to tough hard coatings and may be used as one or both of the so-called base coat and clear coat automotive coatings. This makes them particularly useful for repainting of transportation vehicles in the field.

Depending on use, the compositions and the materials used in the present processes may contain other materials. For example, when used as encapsulants and sealants, the polyurethanes may contain fillers, pigments, and/or antioxidants.

The catalysts can be used for coating applications and generally in areas where curing of polyurethane is required, for example in the adhesive industry and related applications. The polyurethanes made using the catalysts are also suitable as clear or pigmented coatings in industrial and maintenance coating applications.

Coating compositions containing a polyurethane made using the catalysts are suitable for coating a variety of substrates, particularly for providing clear coatings in automotive OEM or refinish applications typically used in coating auto bodies. The coating compositions can be formulated, for example, as clear coating compositions, pigmented compositions, metallized coating compositions, basecoat compositions, monocoat compositions or primers. The substrate is generally prepared with a primer and or a color coat or other surface preparation prior to coating with the coating compositions.

Suitable substrates to which the coating compositions can be applied include automobile bodies, items manufactured and painted by automobile sub-suppliers, frame rails, commercial trucks and truck bodies, including but not limited to beverage bodies, utility bodies, ready mix concrete delivery vehicle bodies, waste hauling vehicle bodies, and fire and emergency vehicle bodies, as well as attachments or components to such truck bodies, buses, farm and construction equipment, truck caps and covers, commercial trailers, consumer trailers, recreational vehicles such as motor homes, campers, conversion vans, vans, pleasure vehicles, pleasure craft snow mobiles, all terrain vehicles, personal watercraft, motorcycles, bicycles, boats, and aircraft.

Other substrates that can be coated with compositions containing the polyurethanes include substrates used in industrial and commercial new construction and maintenance thereof, such as cement and wood floors; walls of commercial and residential structures; office buildings and homes; amusement park equipment; concrete surfaces, such as parking lots and drive ways; asphalt and concrete road surface, wood substrates, marine surfaces; outdoor structures, such as bridges, towers; coil coating; railroad cars; printed circuit boards; machinery; OEM tools; signage; fiberglass structures; sporting goods; golf balls; and sporting equipment.

EXAMPLES

The materials made below were tested as catalysts for polyurethane polymerization. A compounds for use as a catalyst was added to an appropriate solvent (e.g., tetrahydrofuran) and the mixture was subsequently added to one or more alcohols or polyols and one or more isocyanates. The gel times were then measured for these mixtures, both in the presence of oxygen and under nitrogen, as described below.

Example 1

Gel Time Testing of $HGe(SiMe_3)_3$

A 25%, by mass, stock solution was prepared by taking 100 mg of catalyst, $HGe(SiMe_3)_3$, and adding tetrahydrofuran anhydrous until it reached a total mass of 4.00 grams. All samples were prepared under a nitrogen atmosphere. From this stock solution samples at four concentrations were prepared at 20000 ppm, 15000 ppm, 10000 ppm, and 6000 ppm. The standard starting reagents for doing gel time tests, 1.95 g of Desmodur® 3300A and 4.74 g Polyol were used. The 20000 ppm solution was prepared by adding 377 μl of the stock solution to the starting reagents. The 15000 ppm solution was prepared by adding 283 μl of the stock solution to the starting reagents. The 10000 ppm solution was prepared by adding 189 μl of the stock solution to the starting reagents. The 6000 ppm solution was prepared by adding 113 μl of the stock solution to the starting reagents. One of each concentration was kept under nitrogen and one of each concentration was exposed and left open to air. The gel times for these samples are listed in the table below.

TABLE 1

Gel times under air and under nitrogen with tris(trimethylsilyl)germane: $HGe(SiMe_3)_3$ Gel times under air were 2-5 times faster than under nitrogen.

| Concentration (ppm) | Gel Time Air (hours) | Gel Time $N_2$ (hours) |
|---|---|---|
| 6000 | 20 | 43 |
| 10000 | 14 | 38 |
| 15000 | 11 | 34 |
| 20000 | 7 | 31 |

Example 2

Gel Time Testing of $(Me_3Si)_4Sn$

A 3.33%, by mass, stock solution was prepared by taking 100 mg of catalyst, $(Me_3Si)_4Sn$, and adding tetrahydrofuran anhydrous until it reached a total mass of 3.00 grams. All samples were prepared under a nitrogen atmosphere. From this stock solution samples at two concentrations were prepared at 10000 ppm and 5000 ppm. The standard starting reagents for doing gel time tests, 1.95 g of Desmodur® 3300A and 4.74 g Polyol, were used. The 10000 ppm solution was prepared by adding 1415 μl of the stock solution to the starting reagents. The 5000 ppm solution was prepared by adding 707 μl of the stock solution to the starting reagents. One of each concentration was kept under nitrogen and one of each concentration was exposed and left open to air. The gel times for these samples are listed in the table below.

TABLE 2

Gel times under air and under nitrogen with tetrakis(trimethylsilyl)tin: $(Me_3Si)_4Sn$. The catalyst works about 2 times faster upon exposure to air. The overall this tin catalyst is more efficient than germanium catalyst in Table 1.

| Concentration (ppm) | Gel Time Air (hours) | Gel Time $N_2$ (hours) |
|---|---|---|
| 5000 | 0.43 | 0.95 |
| 10000 | 0.43 | 0.75 |

Comparative Example A

Gel Time Testing of $Bu_3Sn(SiMe_3)$

A 25%, by mass, stock solution was prepared by taking 100 mg of catalyst, $Bu_3Sn(SiMe_3)$, and adding tetrahydrofuran anhydrous until it reached a total mass of 4.00 grams. All samples were prepared under a nitrogen atmosphere. From this stock solution samples at four concentrations were prepared at 20000 ppm, 15000 ppm, 10000 ppm, and 6000 ppm. The standard starting reagents for doing gel time tests, 1.95 g of Desmodur® 3300A and 4.74 g Polyol were used. The 20000 ppm solution was prepared by adding 377 µl of the stock solution to the starting reagents. The 15000 ppm solution was prepared by adding 283 µl of the stock solution to the starting reagents. The 10000 ppm solution was prepared by adding 189 µl of the stock solution to the starting reagents. The 6000 ppm solution was prepared by adding 113 µl of the stock solution to the starting reagents. One of each concentration was kept under nitrogen and one of each concentration was exposed and left open to air. The gel times for these samples are listed in the table below. This compound has only one tin-silicon bond, demonstrating that this is not sufficient for adequate catalytic properties, as shown by its time to gel and lack of latency.

TABLE 3

Gel times under air and under nitrogen with trimethylsilyl(tributyl)tin: $Bu_3Sn(SiMe_3)$. This compound has only one tin-silicon bond, demonstrating that this is not generally sufficient for adequate catalytic properties, as shown by its time to gel and lack of latency.

| Concentration (ppm) | Gel Time Air (hours) | Gel Time $N_2$ (hours) |
|---|---|---|
| 6000 | 43 | 43 |
| 10000 | 39 | 39 |
| 15000 | 35 | 35 |
| 20000 | 31 | 31 |

What is claimed is:

1. A process comprising:
   a) providing a catalyst of the formula $(R^1)_n E(SiR^2)_{4-n}$ wherein
   E is tin or germanium;
   $R^1$ and $R^2$ are each independently H, C1 to C10 alkyl, C5 to C12 aryl, silicon, tin or germanium; and
   n is 0, 1 or 2;
   b) providing one or more isocyanate-reactive compound(s);
   c) providing one or more compounds comprising isocyanate group(s);
   d) combining said catalyst, said isocyanate-reactive compound(s) and said isocyanate-comprising compound(s), to form a polyurethane-comprising material.

2. The process of claim 1, wherein E is tin, $R^2$ is methyl and n is 0.

3. The process of claim 2 wherein E is tin and the polyurethane-comprising material formed with said catalyst exposed to air exhibits gel times from 2 to 2.5 times shorter than those of the same polyurethane-comprising materials formed with said catalyst in a nitrogen atmosphere.

4. The process of claim 1 wherein E is germanium and the polyurethane-comprising material formed with said catalyst exposed to air exhibits gel times from 2 to 4.5 times shorter than those of the same polyurethane-comprising materials formed with said catalysts in a nitrogen atmosphere.

5. A process comprising:
   a) providing a catalyst of the formula $HGe(Si(Me)_3)_3$ wherein
   b) providing one or more isocyanate-reactive compound(s);
   c) providing one or more compounds comprising isocyanate group(s);
   d) combining said catalyst, said isocyanate-reactive compound(s) and said isocyanate-comprising compound(s), to form a polyurethane-comprising material.

6. A process comprising:
   a) providing a catalyst of the formula $(Me_3Si)_4Sn$ b) providing one or more isocyanate-reactive compound(s);
   c) providing one or more compounds comprising isocyanate group(s);
   d) combining said catalyst, said isocyanate-reactive compound(s) and said isocyanate-comprising compound(s), to form a polyurethane-comprising material.

* * * * *

UNITED STATES PATENT AND TRADEMARK OFFICE
CERTIFICATE OF CORRECTION

PATENT NO. : 7,625,992 B2  Page 1 of 1
APPLICATION NO. : 11/407003
DATED : December 1, 2009
INVENTOR(S) : Alex Sergey Ionkin It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 571 days.

Signed and Sealed this

Second Day of November, 2010

David J. Kappos
*Director of the United States Patent and Trademark Office*